(12) United States Patent
Nakamura

(10) Patent No.: US 7,561,703 B2
(45) Date of Patent: Jul. 14, 2009

(54) AUDIO SYSTEM, AUDIO APPARATUS, AND METHOD FOR PERFORMING AUDIO SIGNAL OUTPUT PROCESSING

(75) Inventor: Kiyoshi Nakamura, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 946 days.

(21) Appl. No.: 10/968,470

(22) Filed: Oct. 19, 2004

(65) Prior Publication Data

US 2005/0100180 A1 May 12, 2005

(30) Foreign Application Priority Data

Oct. 27, 2003 (JP) ............................. 2003-365766

(51) Int. Cl.
*H04B 1/00* (2006.01)
(52) U.S. Cl. ...................... 381/119; 381/86; 381/80; 700/94; 701/211
(58) Field of Classification Search ............. 381/77–86, 381/110, 119; 700/94; 369/1–5; 701/211
See application file for complete search history.

(56) References Cited

U.S. PATENT DOCUMENTS

| 4,389,639 | A | * | 6/1983 | Torii et al. ................... 340/692 |
| 5,574,514 | A | * | 11/1996 | Tanihira et al. ............. 348/706 |
| 5,577,044 | A | * | 11/1996 | Oxford ........................ 370/522 |
| 5,935,193 | A | * | 8/1999 | Saiki ........................... 701/211 |
| 6,317,687 | B1 | | 11/2001 | Morimoto et al. |
| 6,374,148 | B1 | * | 4/2002 | Dharmarajan et al. ......... 700/94 |
| 6,873,862 | B2 | * | 3/2005 | Reshefsky ............... 455/569.1 |
| 7,187,948 | B2 | * | 3/2007 | Alden ........................ 455/557 |
| 7,190,799 | B2 | * | 3/2007 | Bray et al. .................... 381/86 |
| 2003/0026440 | A1 | * | 2/2003 | Lazzeroni et al. ............. 381/86 |

FOREIGN PATENT DOCUMENTS

JP 2001-116045 4/2001
JP 2001-116581 4/2001

* cited by examiner

*Primary Examiner*—Vivian Chin
*Assistant Examiner*—Fatimat O Olaniran
(74) *Attorney, Agent, or Firm*—Brinks Hofer Gilson & Lione

(57) ABSTRACT

An audio system, an audio apparatus, and a method for performing audio signal output processing are provided that prevent the occurrence of sound interruption of high-priority voice signal output, such as voice guidance for navigation. The audio system includes the audio apparatus communicatively connected to an electronic device for producing an audio signal and to an electronic device for producing a high-priority voice signal (voice guidance signal). When the voice guidance signal is received with the audio signal being received, the audio apparatus starts to perform a mixing operation of the voice guidance signal. If a request for switching a sample rate of the audio signal is made during the mixing operation, the audio apparatus suspends a sample-rate switching operation until the mixing operation is completed.

19 Claims, 8 Drawing Sheets

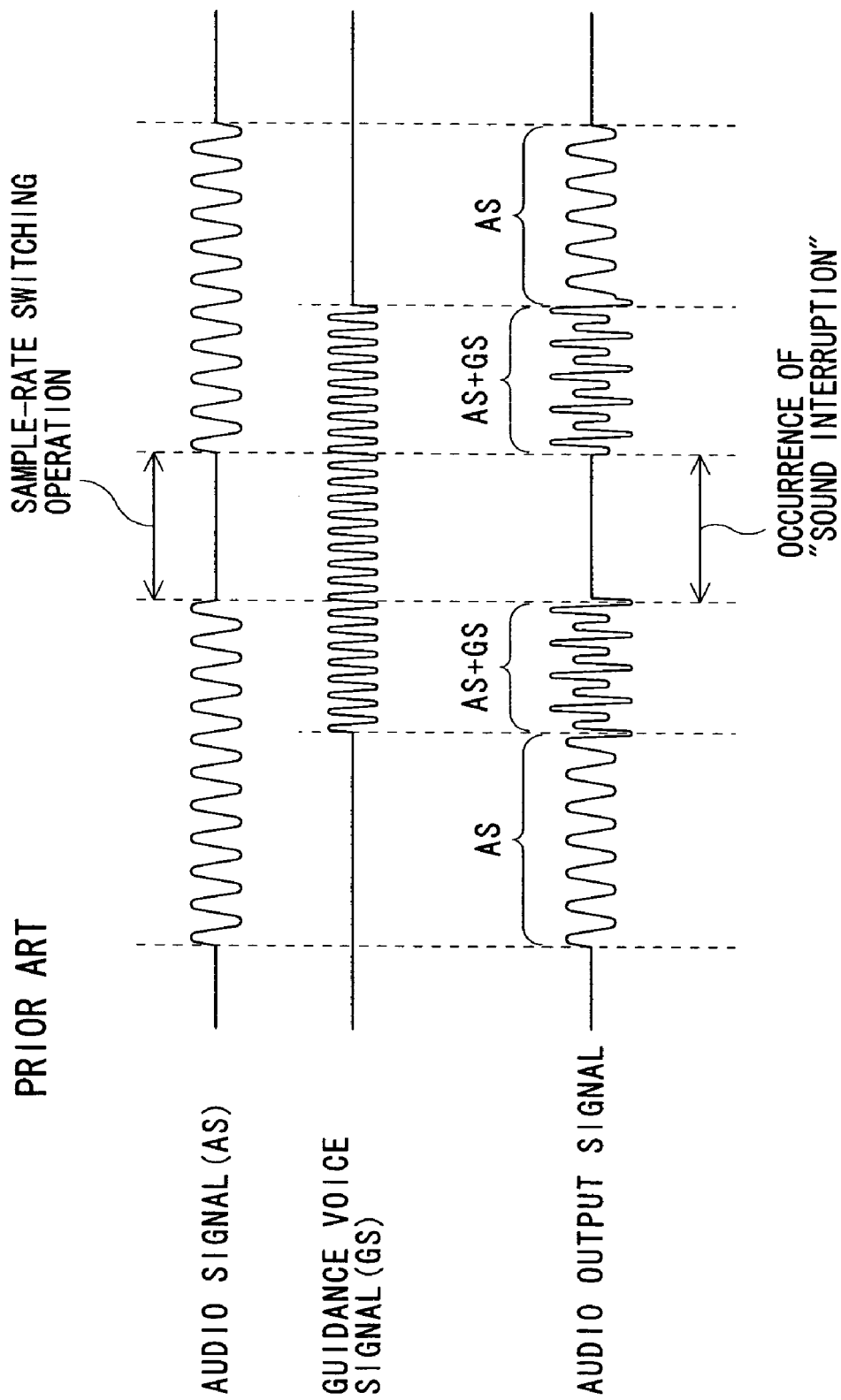

AUDIO SYSTEM, AUDIO APPARATUS, AND METHOD FOR PERFORMING AUDIO SIGNAL OUTPUT PROCESSING

BACKGROUND OF THE INVENTION

1. Field of the Invention

The present invention relates to The present invention relates to audio systems and, more particularly, to an audio system which communicatively interconnects an audio apparatus for reproducing and outputting audio signals and an electronic device for outputting voice guidance via a speaker connected to the audio apparatus, and which is designed to facilitate listening of a voice signal having high priority (hereinafter referred to as "a high-priority voice signal") in outputting it as the guidance voice; to an audio apparatus therein; and to a method for performing audio signal output processing.

The "high-priority voice signal" as described herein indicates important voice guidance information which needs to be recognized by a user. For example, in the case of a vehicle audio system with a vehicle audio apparatus and a navigation apparatus integrated therewith, the high-priority voice signal can represent voice guidance concerning the guidance at an intersection (e.g. a message to turn right after 300 m), which is given by the navigation apparatus to a driver.

2. Description of the Related Art

In recent years, vehicles have been developed to have various kinds of electronic devices installed therein, such as a CD player, a DVD player, an AM/FM tuner, a cassette tape deck, a navigation apparatus, a telephone set, and the like. Most of these electronic devices are stand-alone and are interconnected to one another via common signal lines, such as a bus, to constitute an audio/navigation system. In such a system, a normal method of outputting voice guidance for navigation involves, for example, (i) outputting voice guidance from the respective speakers which are provided in the audio apparatus and in the navigation apparatus. Another prior method for outputting voice guidance involves, for example, (ii) mixing an audio signal and a voice guidance signal for navigation in the audio device to output the mixed result.

Although most of the simple systems employ the method (i), this method disadvantageously renders it difficult for the user (typically, a driver) to listen to the voice guidance when the audio signal and the voice guidance signal for navigation are simultaneously produced. For this reason, in recent years, the method (ii) has been often employed and is designed to permit the user to easily listen to the high-priority voice signal including the voice guidance for navigation.

In this method (that is, the method including mixing and outputting the voice guidance signal for navigation and the audio signal), as shown in one example of the audio signal output processing of FIG. 6, for example, even when the voice guidance signal (high-priority voice signal) GS is received with the audio signal AS being received, a mixing operation (AS+GS) of both signals is carried out in the audio apparatus and a filtering operation is appropriately executed, so that the guidance voice signal GS can be selectively produced. That is, only the high-priority voice signal GS can be listened to.

In recent normal audio systems, most audio signals are recorded in digital form in a recording medium such as a CD, a DVD, an MD, or the like, regardless of whether the audio system is an in-car product or not. The signals in digital form are subjected to digital signal processing by means of a digital signal processor (DSP). In a final stage, they are often subjected to digital/analog (D/A) conversion. In a system aiming for higher audio quality, adjustment of the signals is given by the digital signal processing with the DSP such that each speaker (a woofer, a tweeter, or the like) has its appropriate characteristics, and then the digital signals are converted into analog signals to be produced.

In these systems, the audio signals are finally produced in analog form. Since a main audio signal source has hitherto been the AM/FM tuner, the cassette tape deck, or the like, most of the audio systems which are integrated with electronic devices such as the navigation apparatus, the telephone set, or the like, in most cases perform the mixing operation in analog form in the audio signal output processing. For example, as shown in one example of FIG. 7($a$), in the audio processor, an audio signal from the DVD player or the like in digital form is subjected to digital signal processing by the DSP 51, and then is converted into an analog signal through the D/A converter 52. Thereafter, this analog audio signal and the voice guidance signal from the navigation apparatus or the like in analog form are mixed by the mixing processor 53.

In this case, depending on the output characteristics of the speaker, there may be a problem. For example, in a tweeter, a worse response of the speaker is induced by the input of low frequency components. In contrast, in a woofer, which is a speaker having the characteristics of producing sounds only at the low audio frequencies, a worse response of the speaker is not caused, but output sound pressures at middle and high frequencies become low, thus resulting in difficulty in hearing these sounds. Taking into consideration the foregoing, in the mixing operation of the guidance voice, measures are required to execute the mixing operation for channels with wide reproduction bands, such as channels in full ranges. In cases where the recent vehicle audio system aiming for high audio quality has the navigation apparatus integrated therewith, strict execution of the output processing needs to distribute and output the signals via filters for the respective channels, depending on the characteristics of the speakers connected to the system. In addition, it is necessary to adjust the characteristics of each filter in accordance with the characteristics of the combined signals.

On the other hand, in recent years, audio signals often have been processed in digital form. Some systems including the DSP execute the mixing operation by the DSP. For example, as shown in one example of FIG. 7($b$), in the audio processor, an audio signal from the DVD player or the like in digital form is provided to a mixing processor 55 of a DSP 54, together with a voice guidance signal from the navigation apparatus or the like in digital form, and then is subjected to the digital mixing. Thereafter, the mixed signal is converted into an analog signal through a D/A converter 56, and amplified through an amplifier 57 to be produced therefrom.

As a known technique associated with the foregoing prior art, for example, a navigation system includes an on-vehicle navigation apparatus which produces voice guidance via a speaker connected to a vehicle audio device, wherein voice guidance is produced during intervals between pieces of music reproduced by the vehicle audio device, as disclosed in Japanese Unexamined Patent Publication No. 2001-116581, for example. As another technique, a navigation system adjusts a mixing condition of the volume of an audio device and of the volume of the voice guidance from the navigation apparatus in accordance with the importance of the voice guidance generated from the navigation apparatus, as disclosed in Japanese Unexamined Patent Publication No. 2002-116045, for example.

As mentioned above, prior vehicle audio systems employ the method including mixing the voice guidance signal and the audio signal to produce the mixed result in order to enable easy listening of the high-priority voice signal (voice guidance signal) such as voice guidance for navigation. In this case, however, since there are various kinds of media such as a CD, a DVD, an MD, and the like as described above, the audio signal to be mixed is often switched from one sampling frequency (sample rate) to another, depending on the type of medium. For example, in the case of the CD or the MD, the audio signal is switched to a sample rate of 44.1 kHz, while in the case of the DVD, the audio signal is switched to 48 kHz, 96 kHz, or 192 kHz. Moreover, audio data (music) encoded by an audio compression technique, such as MP3 (MPEG1, audio layer 3), can be recorded and edited in a disc by the user, such as a CD-R, or the like, and this disk has been often reproduced via an audio device. In the case of such a disk, e.g. the CD-R, the sampling frequency varies with every piece of music (i.e. track) at frequent intervals.

When the sample rate is switched, if the data before switching of the sample rate is reproduced at a new sample rate taken after switching, a tone goes high or low, resulting in unnatural sounds. To prevent this phenomenon, it is necessary to switch a filter coefficient (that is, the selection characteristics of an audio output frequency band) according to the sample rate. More concretely, under control of a microcomputer or the like, after data inside the DSP is cleared, the sample rate is switched to the other and a level of the audio signal is adjusted to restart reproduction.

However, since the output timing of voice guidance for the navigation or the like is provided at ii regular intervals, in fact, it is impossible that this output timing is completely off for the duration of the foregoing sample-rate switching operation. As a result, if the timing of the sample-rate switching operation overlaps with the timing of the voice guidance for navigation, the output of the voice guidance signal GS is interrupted, that is, so-called "sound interruption" occurs, during the sample-rate switching operation, as shown in one example of the audio signal output processing in FIG. 8, thus disadvantageously rendering it difficult for the user to listen to the navigation voice guidance or the like at least in part.

SUMMARY OF THE INVENTION

The present invention has been accomplished in view of the foregoing problems encountered with the prior art, and it is an object of the invention to provide an audio system that prevents the occurrence of sound interruption of high-priority voice signals, such as voice guidance for navigation; an audio apparatus therein; and a method of performing audio signal output processing.

In order to solve the problems described above, according to one aspect of the present invention, there is provided an audio system that comprises at least one electronic device for producing an audio signal, at least one electronic device for producing a high-priority voice signal which needs to be recognized by a user as voice guidance, and an audio apparatus connected to each electronic device via a bus, for selectively producing the audio signal or the high-priority voice signal from each electronic device via a speaker, wherein, when receiving the high-priority voice signal with the audio signal being received via the bus, the audio apparatus starts to perform a mixing operation of the high-priority voice signal, and if a request for switching a sample rate of the audio signal is made during the mixing operation, then the audio apparatus suspends a sample-rate switching operation until the mixing operation is completed.

In the audio system with this arrangement, the sample-rate switching operation is suspended during the mixing operation of the audio signal and the high-priority voice signal, thereby preventing the output of the voice guidance signal (high-priority voice signal) from being interrupted, that is, preventing the sound interruption, which occurred in the prior art (see FIG. 8), during the sample-rate switching operation. This can eliminate the disadvantage that the high-priority voice signal, such as voice guidance for navigation, is difficult to hear at least in part.

According to another aspect of the invention, there is provided an audio system that comprises at least one electronic device for producing an audio signal, at least one electronic device for producing a high-priority voice signal which needs to be recognized by a user as voice guidance, and an audio apparatus connected to each electronic device via a bus, for selectively producing the audio signal or the high-priority voice signal from each electronic device via a speaker, wherein, when receiving the high-priority voice signal while a sample-rate switching operation of the audio signal received via the bus is being carried out, the audio apparatus suspends a mixing operation of the high-priority voice signal until the sample-rate switching operation is completed.

In the audio system with this arrangement, when the mixing operation occurs during the sample-rate switching operation, the mixing operation is suspended until the sample-rate switching operation is completed, thereby preventing the output of the voice guidance signal (high-priority voice signal) from being interrupted during the sample-rate switching operation, that is, preventing the occurrence of a sound interruption, as is the case with the prior art audio system.

According to still another aspect of the invention, there is provided an audio apparatus corresponding to each of the audio systems described above. Specifically, the audio apparatus according to another aspect of the invention comprises a sample rate matching section for matching a sample rate of an audio signal with a sample rate of a high-priority voice signal which needs to be recognized by a user as voice guidance, a mixing processor for performing a mixing operation of the audio signal and the high-priority voice signal, the sample rates of these signals being matched to one another, a filter processor for switching selection characteristics of an audio output frequency band according to the matched sample rate, and a speaker for producing the high-priority voice signal or the audio signal, which is selectively produced through said filter processor, wherein, when the high-priority voice signal is received with the audio signal being received, a mixing operation of the high-priority voice signal is started, and if a request for switching a sample rate of the audio signal is made during the mixing operation, then a sample-rate switching operation is suspended until the mixing operation is completed.

According to a further aspect of the invention, there is provided an audio apparatus that comprises a sample rate matching section for matching a sample rate of an audio signal with a sample rate of a high-priority voice signal which needs to be recognized by a user as voice guidance, a mixing processor for performing a mixing operation of the audio signal and the high-priority voice signal, the sample rates of these signals being matched to one another, a filter processor for switching selection characteristics of an audio output frequency band according to the matched sample rate, and a speaker for producing the high-priority voice signal or the audio signal, which is selectively produced through the filter processor, wherein, when the high-priority voice signal is received while a sample-rate switching operation of the audio signal is being carried out, a mixing operation of the high-priority voice signal is suspended until the sample-rate switching operation is completed.

According to a still further aspect of the invention, there is provided a method for performing audio signal output processing which corresponds to each of the audio systems described above. Specifically, the audio signal output processing method according to a further aspect of the invention comprises the steps of: when the high-priority voice signal is received with the audio signal being received, starting to perform a mixing operation of the high-priority voice signal, while selectively producing the high-priority voice signal via the speaker; if a request for switching a sample rate of the audio signal is made during the mixing operation, suspending a sample-rate switching operation until the mixing operation is completed; and when the mixing operation is completed and the sample-rate switching operation is also completed, producing the audio signal associated with the sample-rate switching operation via the speaker.

According to a yet further aspect of the invention, there is provided an audio signal output processing method that comprises the steps of: producing the audio signal via the speaker, while, when the high-priority voice signal is received with a sample-rate switching operation of the audio signal being carried out, suspending a mixing operation of the high-priority voice signal until the sample-rate switching operation is completed; and when the sample-rate switching operation is completed, starting the mixing operation, while selectively producing the high-priority voice signal via the speaker.

BRIEF DESCRIPTION OF THE DRAWINGS

FIG. 8 depicts signal waveforms for explanation of the audio signal output processing when a sample-rate switching operation is executed in the prior art system.

DESCRIPTION OF THE PREFERRED EMBODIMENTS

Preferred embodiments of the present invention will be described hereinafter with reference to the accompanying drawings.

Figure 1:
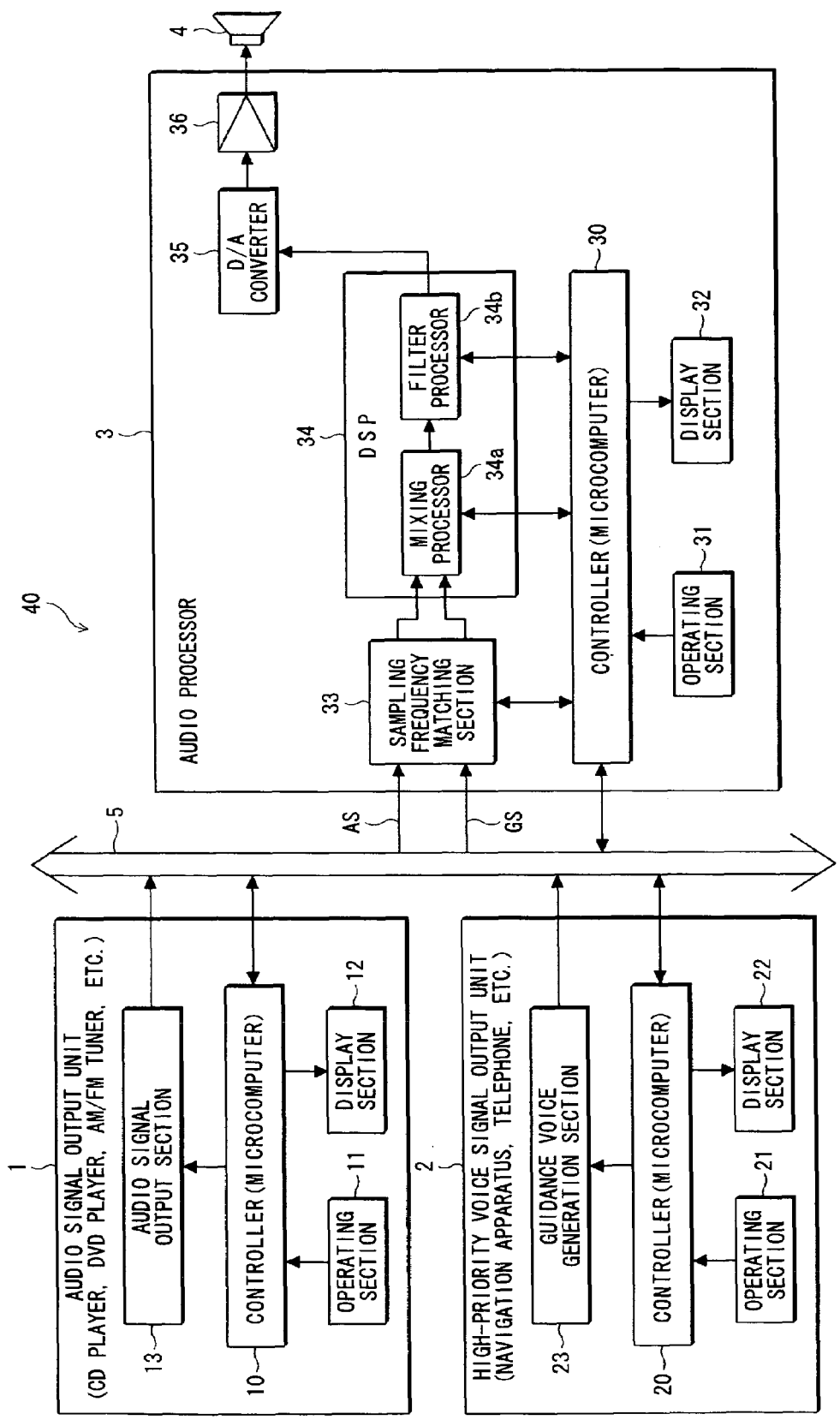
FIG. 1 is a block diagram showing a configuration of a vehicle audio system according to one preferred embodiment of the present invention.

FIG. 1 illustrates a configuration of a vehicle audio system according to one preferred embodiment of the present invention.

As shown in the figure, a vehicle audio system 40 of the present embodiment includes an audio signal output unit 1 for producing an audio signal, a high-priority voice signal output unit 2 for producing a high-priority voice signal which needs to be recognized by a user as voice guidance, and an audio processor 3 communicatively connected to each of these output units 1 and 2 via a bus 5. To the audio processor 3 is connected a speaker 4, through which an audio signal AS or a guidance voice signal (high-priority voice signal) GS from each of the output units 1 and 2 is selectively reproduced. Although, in this example, for simplification, there is shown only one speaker 4, there are in fact provided three speakers, i.e. a woofer, a squawker, and a tweeter for low frequency band, medium frequency band, and high frequency band, respectively, at predetermined positions inside a vehicle.

The audio signal output unit 1 includes a CD player, a DVD player, an MD player, an AM/FM tuner, a cassette tape deck, or the like. The high-priority voice signal output unit 2 includes a navigation apparatus, a telephone set, an emergency broadcast receiver, or the like. The telephone set can be a unit with only a telephoning function or a unit with a telephoning function and an emergency calling function. In either case, since the voice guidance signal (high-priority voice signal) from the output unit 2 should be surely recognized by the user because of its function, it is preferentially reproduced, as explained later.

The audio signal output unit 1 includes a controller 10, such as a microcomputer, for controlling the entire unit 1 and also for controlling sent and received data or the like to and from the bus 5, an operating section 11 including various operation keys from which the user enters operation instructions, a display section 12 including a display screen constructed by a liquid crystal display (LCD) or the like, and an audio signal output section 13 for supplying the audio signal based on control given by the controller 10. For example, in a case where the unit 1 is a CD player, the controller 10 reads signals recorded in a CD selected by the user, in response to an operation instruction given from the operating section 11, and sends the reproduced audio signal to the bus 5 via the audio signal output section 13.

As is the case with the general configuration of the audio signal output unit 1, the high-priority voice signal output unit 2 includes a controller 20 for controlling the entire unit 2 and also for controlling sent and received data or the like to and from the bus 5, an operating section 21 from which the user enters operation instructions, a display section 22 such as a LCD or the like, and a guidance voice generating section 23 for generating voice guidance (high-priority audio or voice) under control of the controller 20. For example, in a case where the unit 2 is a navigation apparatus, the controller 20 performs control operations required for route search, route guidance based thereon, or the like, as basic processing. In addition, as processing associated with the present invention, the controller performs a control operation required for generating voice guidance (high-priority audio). In this case, the guidance voice generating section 23, when the vehicle reaches a point located at a predetermined distance from a target point for guidance during the route guidance, is adapted to generate voice guidance announcing the guidance target point (a message to "turn right after 300 m" in the case of an intersection, for example). The guidance voice (data) generated is temporarily stored in a memory (not shown) embedded in the controller 20, and then sent onto the bus 5.

The audio processor 3 similarly includes a controller 30 for controlling the entire unit 3 and also for controlling sent and received data or the like to and from the bus 5, an operating section 31 from which the user enters operation instructions, a display section 32 such as a LCD or the like, a sampling frequency (sample rate) matching section 33 for matching the sample rate of the audio signal AS with the sample rate of the voice guidance signal GS, both signals having been transmitted via the bus 5, a DSP 34 for performing digital signal processing of the audio signal AS and the voice guidance signal GS, the sample rates of which signals are matched to each other, a D/A converter 35 for converting a digital signal from the DSP 34 into an analog signal, and an amplifier 36 for amplifying the audio signal (the audio signal AS or the voice guidance signal GS), which has been converted into analog form. The DSP 34 includes a mixing processor 34a for performing a mixing operation of the audio signal AS and the voice guidance signal GS, the sample rates of which signals are matched to each other, and a filter processor 34b for switching a filter coefficient (selection characteristics of an audio output frequency band) according to the sample rate. Through this filter processor 34b, the voice guidance signal GS or the audio signal AS is selectively supplied to the speaker 4 via the D/A converter 35 and the amplifier 36.

The sampling frequency matching section 33 is adapted to adjust the sample rate so that the DSP 34 can perform the digital signal processing as described above. The matching section can have the following form as a means for adjusting the sample rate. In one form is employed a method including capturing the voice guidance signal GS using a clock with the same frequency as the sampling frequency (clock) of the audio signal AS. Note that, because, in this case, the voice guidance signal GS is frequently provided in analog form, A/D conversion is required. Alternatively, another method may include employing a sample rate converter for converting the sampling frequency of the audio signal AS to the sampling frequency inside the DSP 34 (for example, 48 kHz).

In the vehicle audio system 40 with the foregoing arrangement according to the present embodiment, the audio signal output unit 1 and the high-priority voice signal output unit 2 correspond to "electronic devices", and the audio processor 3 corresponds to an "audio apparatus".

Next, the output processing of the audio signals (audio signal AS/voice guidance signal GS) performed by the audio processor 3 in the vehicle audio system 40 of the present embodiment will be explained below with reference to FIG. 4, which shows an example of an output signal waveform corresponding to a processing flowchart of FIG. 2, as well as FIG. 2, which shows an example of the processing flowchart.

First, at step S11, an audio signal AS received from the audio signal output unit 1 (for example, a DVD player) via the bus 5 is produced from the speaker 4 via the sampling frequency matching section 33, the DSP 34, the D/A converter 35, and the amplifier 36 (see FIG. 4), under control of the controller 30.

At a next step S12, the controller 30 determines whether a high-priority voice signal (e.g. a voice guidance signal from the navigation apparatus) GS is received (YES) or not (NO) from the high-priority voice signal output unit 2 via the bus 5. That is, since the voice guidance signal GS for navigation or the like is generated at irregular intervals, when it is in fact generated from the output unit 2, a notice is supplied to the bus 5 that the voice guidance signal GS is being provided. The audio processor 3 carries out monitoring of signals on the bus 5 to determine the presence or absence of the received voice guidance signal GS. If yes, the operation proceeds to step S13. In contrast, if no, the present processing terminates.

Figure 4:
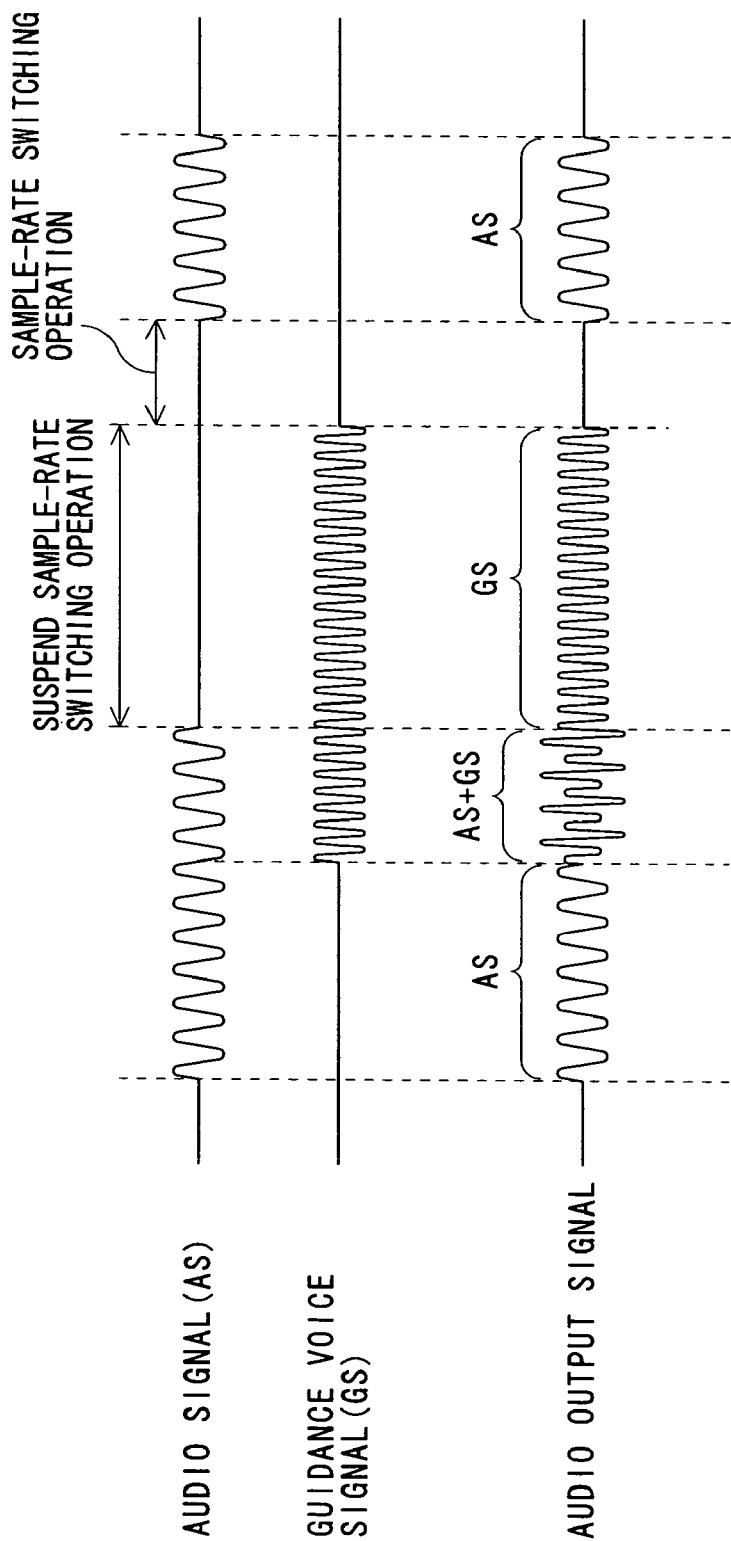
FIG. 4 depicts signal waveforms for supplementary explanation of the processing flowchart of FIG. 2.

At step S13, the sampling frequencies of the audio signal AS and of the voice guidance signal GS are matched to each other by the sampling frequency matching section 33 under the control of the controller 30, and then the mixing operation of both signals AS and GS is started by the mixing processor 34a of the DSP 34 (see FIG. 4). Through the filter processor 34b, the voice guidance signal GS is selectively produced from the speaker 4 via the D/A converter 35 and the amplifier 36. During the mixing operation, a notice is given by the controller 30 to the bus 5 that the mixing operation is being carried out.

At a next step S14, the controller 30 determines whether an event of sample-rate switching (i.e., the existence of a piece of music or a track which needs to switch the sampling frequency) occurs or not by monitoring the audio signal AS on the bus 5. That is, the controller determines whether a request for switching the sample rate is made (YES) or not (NO). If yes, the operation proceeds to step S15, while, if no, the operation proceeds to step S19.

At step S15, the sample-rate switching operation is suspended under the control of the controller 30. In short, reproducing the audio signal AS associated with the sample-rate switching is suspended (see FIG. 4).

At a next step S16, the controller 30 determines whether the mixing operation started from step S13 has been completed (YES) or not (NO). If yes, the operation proceeds to step S17, while, if no, this determination is repeatedly carried out. After the completion of the mixing operation, a notice indicative of this completion is supplied to the bus 5.

At a next step S17, the sample-rate switching operation is carried out based on the control of the controller 30 (see FIG. 4). At this time, a notice is supplied to the bus 5 by the controller 30 that the sample-rate switching operation is being carried out.

At a next step S18, the sample-rate switching event, that is, reproduction of the audio signal AS associated with the sample-rate switching, which reproduction has been suspended, is started under the control of the controller 30, so that this audio signal is produced (see FIG. 4), thus leading to the end of the present processing.

On the other hand, at step S19, that is, when the request for the sample-rate switching operation is not made, it is determined whether the mixing operation is completed (YES) or not (NO), in the same way as the processing at step S16. If yes, this leads to the end of the present processing, while, if no, this determination is repeatedly carried out.

Figure 3:
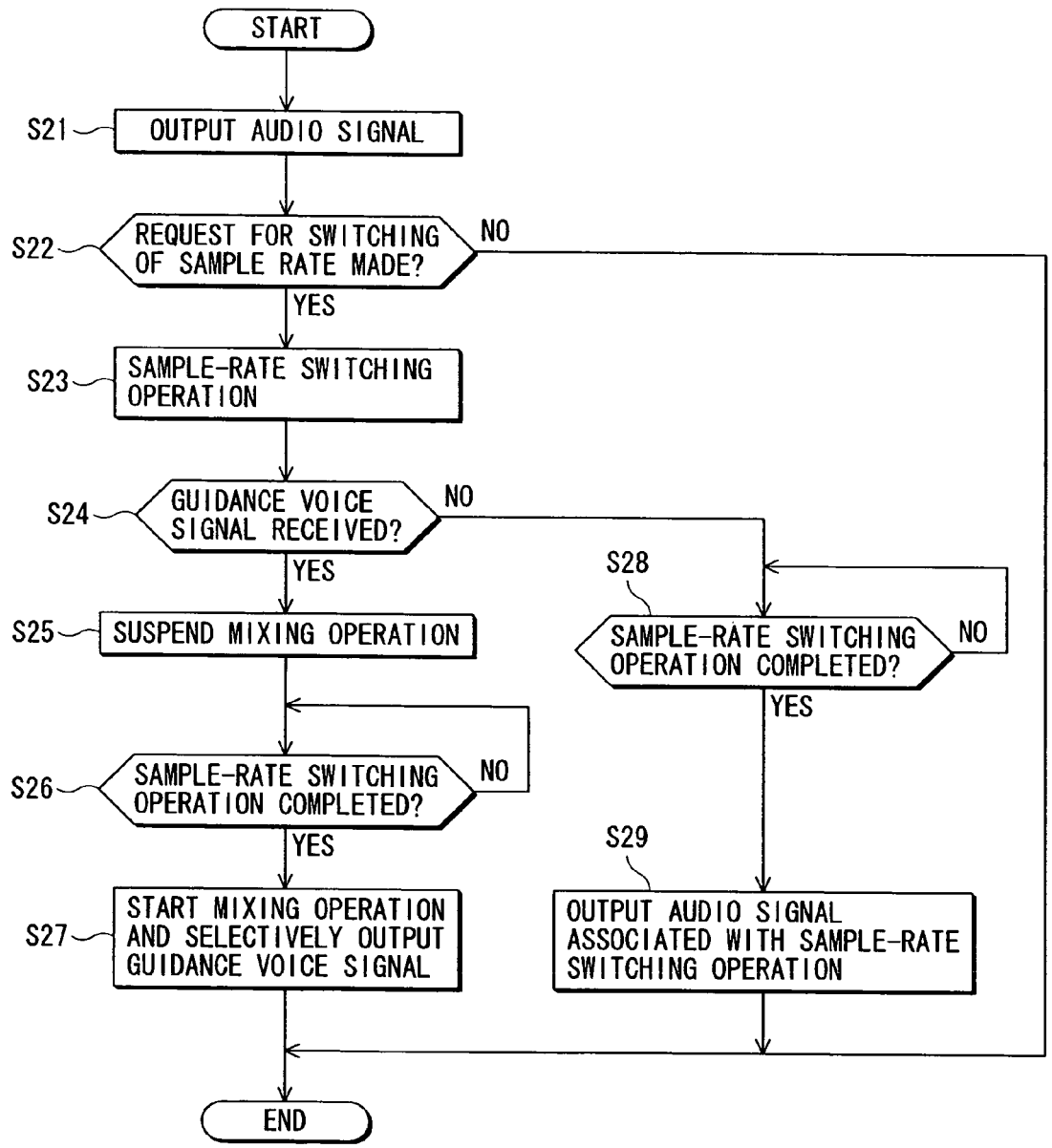
FIG. 3 is a flowchart showing another example of the audio signal output processing which is carried out by the audio processor in the vehicle audio system of FIG. 1.

Next, the output processing of the audio signals (audio signal/ voice guidance signal) performed by the audio processor 3 in the vehicle audio system 40 of the present embodiment will be explained below with reference to FIG. 5, which shows another example of an output signal waveform corresponding to a processing flowchart of FIG. 3, as well as FIG. 3, which shows another example of the processing flowchart.

Figure 2:
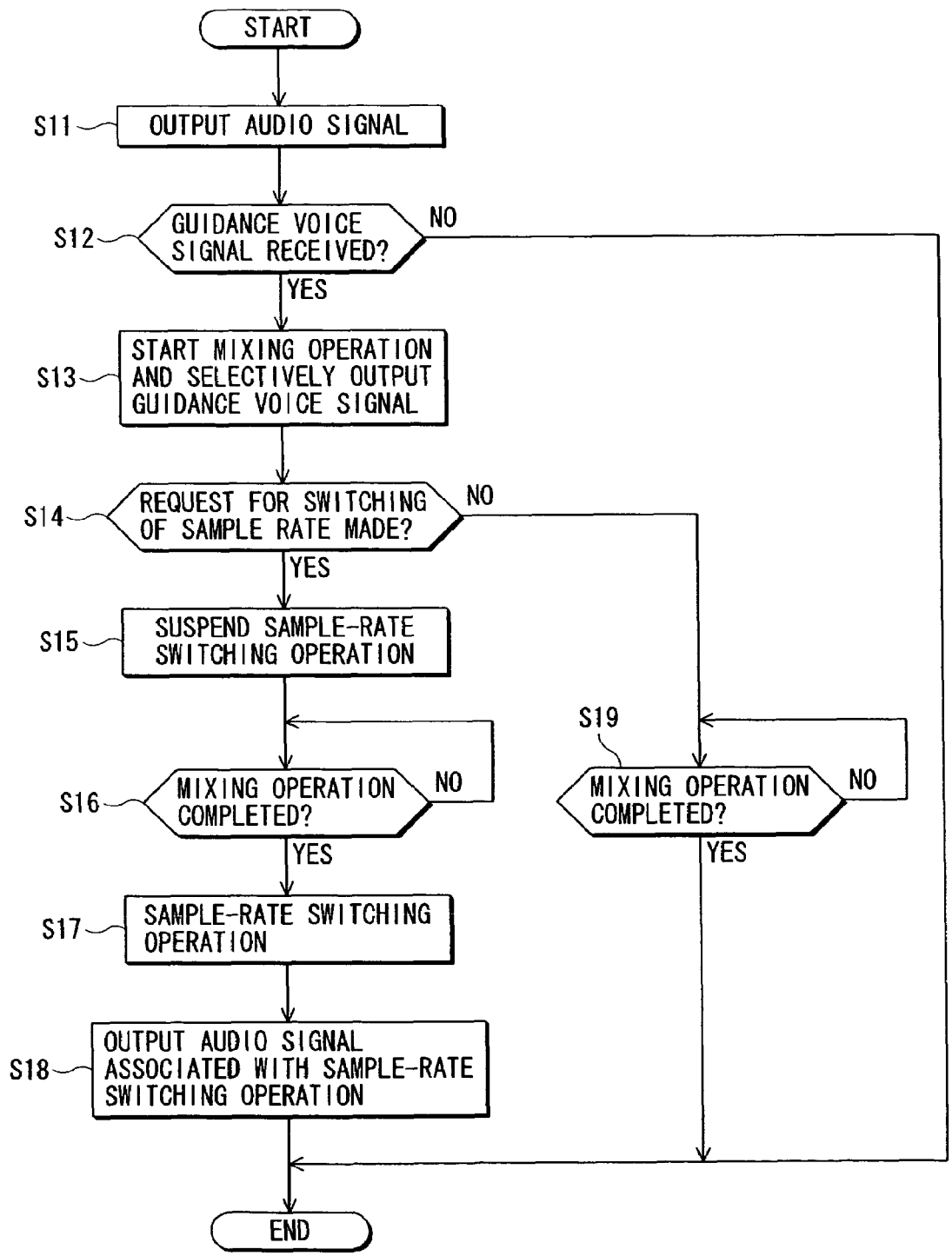
FIG. 2 is a flowchart showing an example of audio signal output processing which is carried out by an audio processor in the vehicle audio system of FIG. 1.

First, at step S21, an audio signal AS received from the audio signal output unit 1 (for example, the DVD player) via the bus 5 is produced from the speaker 4 (see FIG. 5), in the same way as the processing performed at step S11 (FIG. 2).

At a next step S22, the controller 30 determines whether a request for switching the sample rate is made (YES) or not (NO), in the same way as the processing performed at step S14 (FIG. 2). If yes, the operation proceeds to step S23, while, if no, the operation leads to the end of the present flowchart.

At step S23, the sample-rate switching operation is carried out (see FIG. 5), in the same way as the processing performed at step S17 (see FIG. 2), and then a notice of the sample-rate switching operation is supplied to the bus 5.

At a next step S24, the controller 30 determines whether a high-priority voice signal (e.g. a voice guidance signal from the navigation apparatus) GS is received (YES) or not (NO) from the high-priority voice signal output unit 2 via the bus 5, in the same way as the processing performed at step S12 (FIG. 2). If yes, the operation proceeds to step S25, while, if no, the operation proceeds to step S28.

Figure 5:
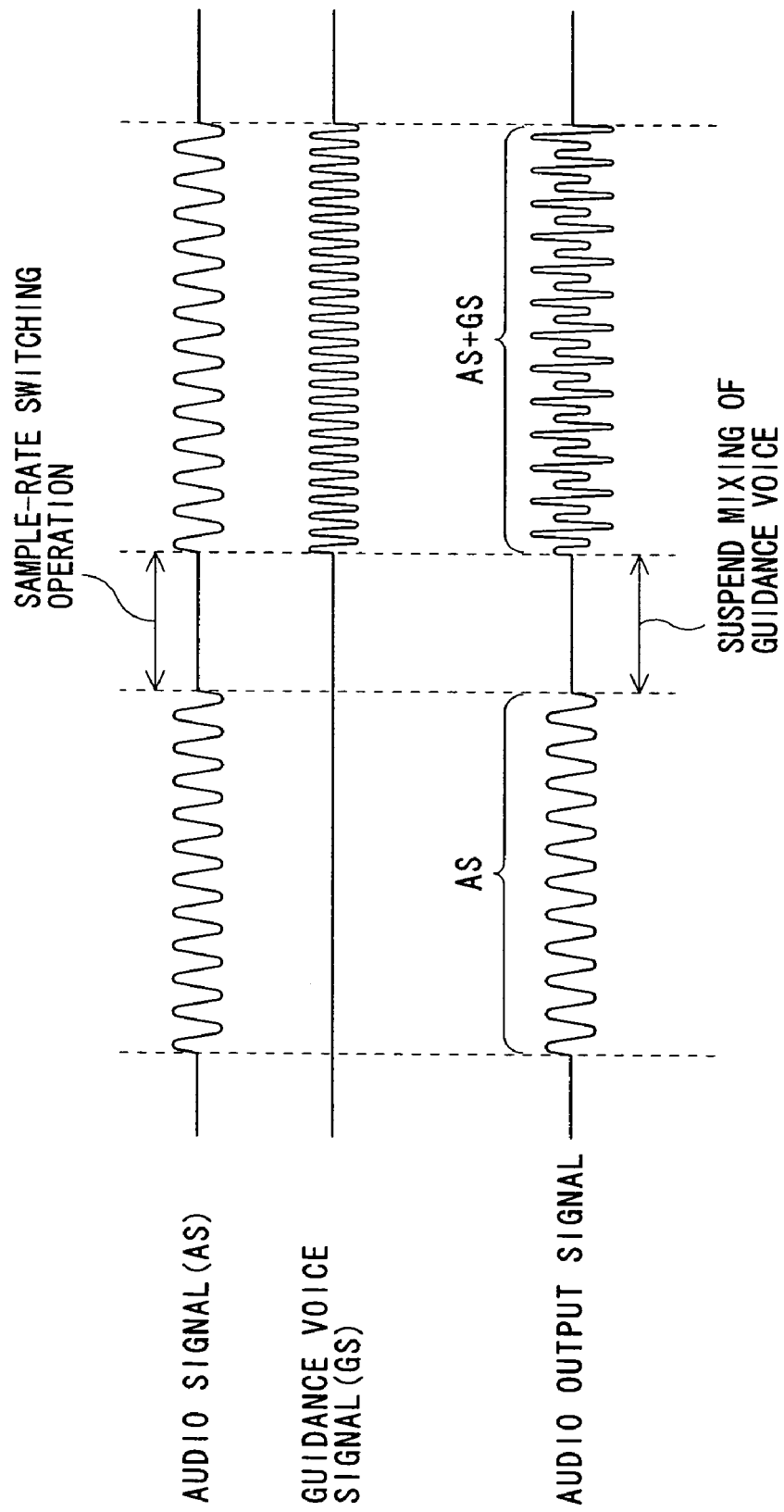
FIG. 5 depicts signal waveforms for supplementary explanation of the processing flowchart of FIG. 3.
Figure 6:
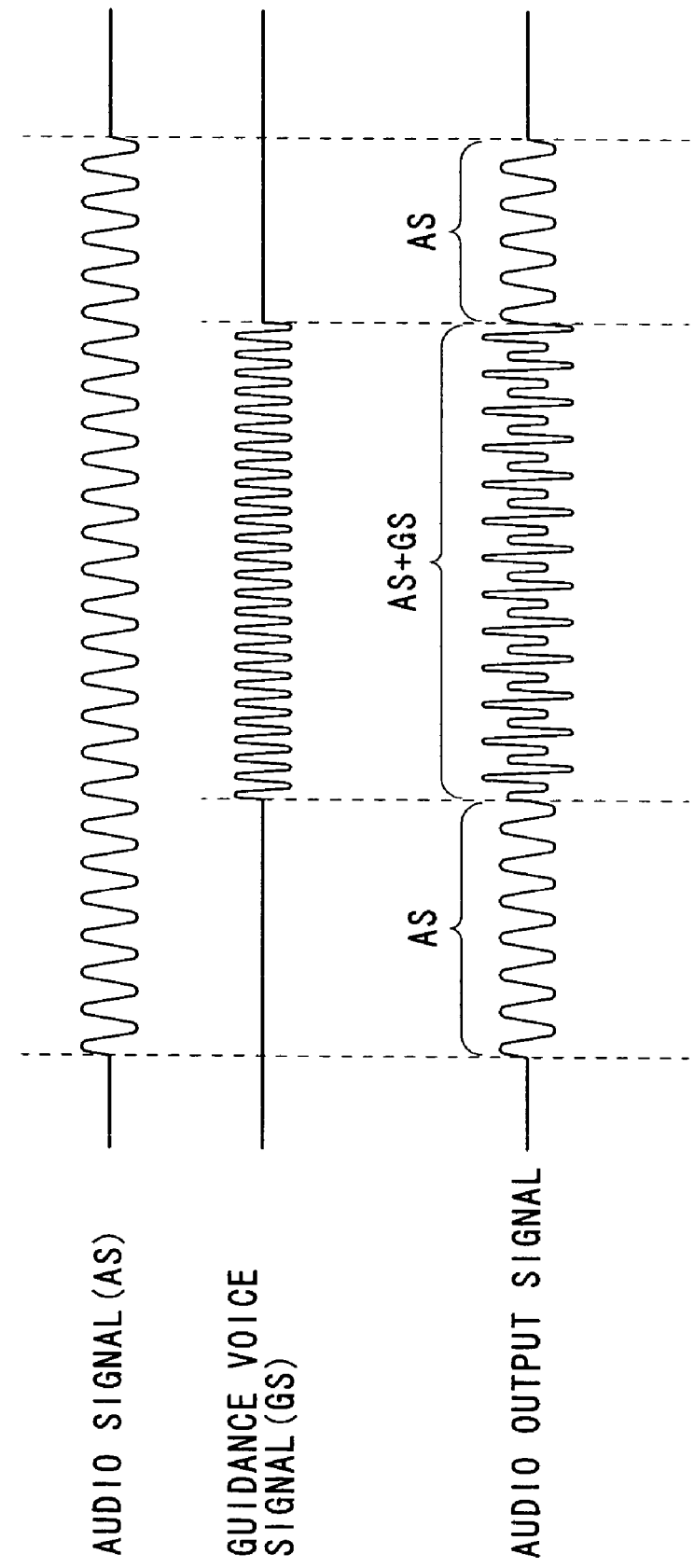
FIG. 6 depicts signal waveforms for explanation of audio signal output processing in a prior art vehicle audio system.
Figure 7A:
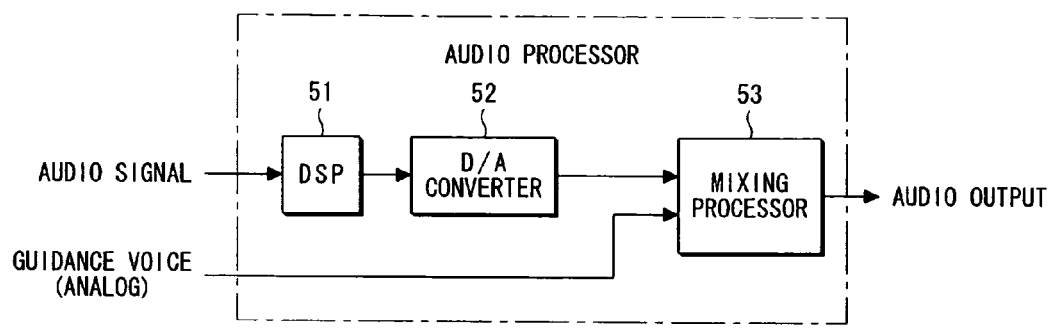
FIG. 7 is a block diagram showing a configuration of a prior art audio processor which performs a mixing operation of voice guidance.
Figure 7B:
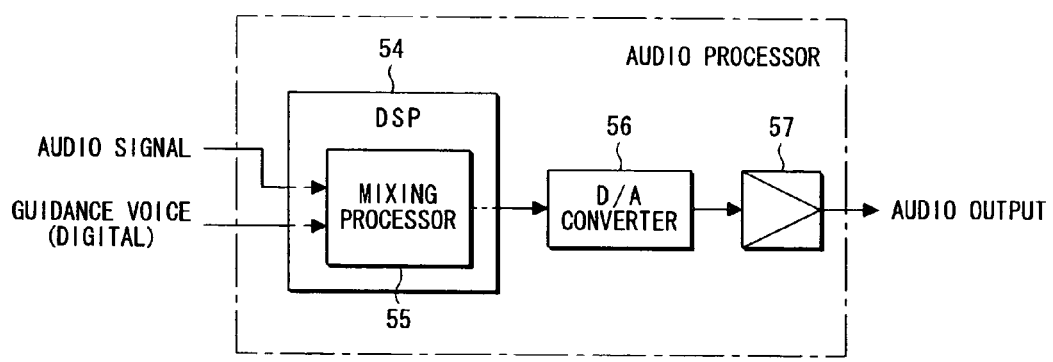

At step S25, the mixing operation of the voice guidance signal GS is suspended under the control of the controller 30 (see FIG. 5).

At a next step S26, the controller 30 determines whether the sample-rate switching operation is completed (YES) or not (NO). If yes, the operation proceeds to step S27. If no, the determination is repeatedly carried out. Similarly, after the sample-rate switching operation is completed, a notice of the completion is supplied to the bus 5.

At a next step S27, the sampling frequency of the audio signal AS and one of the voice guidance signal GS are matched to each other under the control of the controller 30, in the same way as the processing performed at step S13 (see FIG. 2), and then the mixing operation of both signals AS and GS is started (see FIG. 5). Further, the voice guidance signal GS is selectively produced from the speaker 4. Similarly, during the mixing operation, a notice is supplied to the bus 5 that the mixing operation is being carried out. This leads to the end of the present processing.

On the other hand, at step S28, that is, when the voice guidance signal GS is not received, it is determined whether the sample-rate switching operation is completed (YES) or not (NO), in the same way as the processing performed at step S26. If yes, the operation proceeds to step S29. If no, the determination is repeatedly carried out.

At step S29, the audio signal AS associated with the sample-rate switching operation is reproduced, in the same way as the processing performed at step S18 (FIG. 2), thus leading to the end of the present processing.

As can be seen from the above description, according to the vehicle audio system 40 (FIG. 1) and the audio signal output processing method (FIGS. 2 and 3) of the present embodiments, during the mixing operation of the audio signal AS and the voice guidance signal GS, the sample-rate switching operation is suspended (see FIGS. 2 and 4), thereby preventing the output of the voice guidance signal GS from being interrupted in the sample-rate switching operation, that is, preventing the "sound interruption" which might occur in the prior art (FIG. 8). This can eliminate the disadvantage that the high-priority voice signal (voice guidance signal GS), such as voice guidance for navigation, is difficult to hear to at least in part. Also, in the audio system of the present embodiment, when the mixing operation is requested during the sample-rate switching operation, the mixing operation is suspended until the sample-rate switching operation is completed (see FIGS. 3 and 5), thereby preventing the voice guidance signal GS from being interrupted during the sample-rate switching operation, as with the foregoing audio signal output processing method (FIGS. 2 and 4).

What is claimed is:

1. An audio system comprising:
    at least one electronic device for producing a digital audio signal;
    at least one electronic device for producing a high-priority voice signal; and
    an audio apparatus connected to each electronic device, for selectively producing said audio signal and/or said high-priority voice signal via a speaker,
    wherein, when receiving said high-priority voice signal with said audio signal being received, said audio apparatus starts to perform a mixing operation of said high-priority voice signal, and if a request for switching a sample rate of said digital audio signal from one non-zero sample rate to a different non-zero sample rate is made during the mixing operation, said audio apparatus suspends a sample-rate switching operation until said mixing operation is completed.

2. The audio system according to claim 1, wherein said electronic device for producing said audio signal is one of a CD player, a DVD player, an MD player, an FM/AM tuner, and a cassette tape deck; and
    wherein said electronic device for producing said high-priority voice signal is one of a navigation apparatus, a telephone set, and an emergency broadcast receiver.

3. An audio system comprising:
    at least one electronic device for producing a digital audio signal;
    at least one electronic device for producing a high-priority voice signal; and
    an audio apparatus connected to each electronic device, for selectively producing said audio signal and/or said high-priority voice signal via a speaker,
    wherein, when receiving said high-priority voice signal while a sample-rate switching operation of said digital audio signal is being carried out to switch from one non-zero sample rate to a different non-zero sample rate, said audio apparatus suspends a mixing operation of said high-priority voice signal until said sample-rate switching operation is completed.

4. The audio system according to claim 3, wherein said electronic device for producing said audio signal is one of a CD player, a DVD player, an MD player, a FM/AM tuner, and a cassette tape deck; and
    wherein said electronic device for producing said high-priority voice signal is one of a navigation apparatus, a telephone set, and an emergency broadcast receiver.

5. An audio apparatus comprising:
    a sample rate matching section for matching a sample rate of a digital audio signal with a sample rate of a high-priority voice signal;
    a mixing processor for performing a mixing operation of the audio signal and the high-priority voice signal, the sample rates of said signals being matched to one another;
    a filter processor for switching selection characteristics of an audio output frequency band according to said matched sample rate; and
    a speaker for producing the high-priority voice signal and/or the audio signal, which is selectively produced from said filter processor,
    wherein, when said high-priority voice signal is received with said audio signal being received, a mixing operation of said high-priority voice signal is started, and if a request for switching a sample rate of said digital audio signal from one non-zero sample rate to a different non-zero sample rate is made during the mixing operation, then a sample-rate switching operation is suspended until said mixing operation is completed.

6. The audio apparatus according to claim 5, wherein, when the mixing operation of said high-priority voice signal is started, said audio apparatus selectively produces said high-priority voice signal via said speaker.

7. The audio apparatus according to claim 5, wherein, when said mixing operation is completed and said sample-rate switching operation is also completed, said audio apparatus produces the audio signal associated with the sample-rate switching operation via said speaker.

8. The audio apparatus according to claim 5, wherein said sample rate matching section captures the high-priority voice signal using a clock with the same frequency as the sample rate of said audio signal.

9. The audio apparatus according to claim 5, wherein said sample rate matching section includes a converter for converting the sample rate of said audio signal into a sample rate to be used in said mixing processor.

10. The audio apparatus according to claim 5, wherein a digital signal processor (DSP) constitutes said mixing processor and said filter processor.

11. An audio apparatus comprising:
- a sample rate matching section for matching a sample rate of a digital audio signal with a sample rate of a high-priority voice signal;
- a mixing processor for performing a mixing operation of the audio signal and the high-priority voice signal, the sample rates of said signals being matched to one another;
- a filter processor for switching selection characteristics of an audio output frequency band according to the matched sample rate; and
- a speaker for producing the high-priority voice signal and/or the audio signal, which is selectively produced from said filter processor,
- wherein, when said high-priority voice signal is received while a sample-rate switching operation of said digital audio signal is being carried out to switch from one non-zero sample rate to a different non-zero sample rate, a mixing operation of said high-priority voice signal is suspended until said sample-rate switching operation is completed.

12. The audio apparatus according to claim 11, wherein, when the sample-rate switching operation is completed, said audio apparatus starts said mixing operation, while selectively producing said high-priority voice signal via said speaker.

13. The audio apparatus according to claim 11, wherein said sample rate matching section captures the high-priority voice signal using a clock with the same frequency as the sample rate of said audio signal.

14. The audio apparatus according to claim 11, wherein said sample rate matching section includes a converter for converting the sample rate of said audio signal into a sample rate to be used in said mixing processor.

15. The audio apparatus according to claim 11, wherein a digital signal processor (DSP) constitutes said mixing processor and said filter processor.

16. A method for performing audio signal output processing in an audio system which includes an audio apparatus communicatively connected to an electronic device for producing a digital audio signal and to an electronic device for producing a high-priority voice signal, the audio apparatus being adapted to selectively produce via a speaker said audio signal and/or said high-priority voice signal from each electronic device, the method comprising:
- when said high-priority voice signal is received with said audio signal being received, starting to perform a mixing operation of said high-priority voice signal, while selectively producing said high-priority voice signal via said speaker;
- if a request for switching a sample rate of said digital audio signal from one non-zero sample rate to a different non-zero sample rate is made during said mixing operation, suspending a sample-rate switching operation until said mixing operation is completed; and
- when said mixing operation is completed and said sample-rate switching operation is also completed, producing the audio signal associated with the sample-rate switching via said speaker.

17. A method for performing audio signal output processing in an audio system which includes an audio apparatus communicatively connected to an electronic device for producing a digital audio signal and to an electronic device for producing a high-priority voice signal, the audio apparatus being adapted to selectively produce via a speaker said audio signal or said high-priority voice signal from each electronic device, the method comprising:
- producing said audio signal via said speaker, while, when said high-priority voice signal is received with a sample-rate switching operation of said digital audio signal being carried out to switch from one non-zero sample rate to a different non-zero sample rate, suspending a mixing operation of said high-priority voice signal until said sample-rate switching operation is completed; and
- when the sample-rate switching operation is completed, starting said mixing operation, while selectively producing said high-priority voice signal via said speaker.

18. The method according to claim 16, wherein said high-priority voice signal is a voice guidance signal from a navigation apparatus.

19. The method according to claim 17, wherein said high-priority voice signal is a voice guidance signal from a navigation apparatus.

* * * * *